United States Patent
Suzumura et al.

(10) Patent No.: US 10,211,235 B2
(45) Date of Patent: Feb. 19, 2019

(54) DISPLAY DEVICE AND MANUFACTURING METHOD THEREOF

(71) Applicant: Japan Display Inc., Tokyo (JP)

(72) Inventors: Isao Suzumura, Tokyo (JP); Hajime Watakabe, Tokyo (JP); Akihiro Hanada, Tokyo (JP); Hirokazu Watanabe, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/678,501

(22) Filed: Aug. 16, 2017

(65) Prior Publication Data
US 2018/0076239 A1    Mar. 15, 2018

(30) Foreign Application Priority Data
Sep. 14, 2016   (JP) .................................. 2016-179378

(51) Int. Cl.
| | |
|---|---|
| H01L 27/12 | (2006.01) |
| H01L 21/02 | (2006.01) |
| H01L 29/423 | (2006.01) |
| H01L 29/66 | (2006.01) |
| H01L 29/786 | (2006.01) |
| G03F 7/00 | (2006.01) |

(Continued)

(52) U.S. Cl.
CPC .......... *H01L 27/1251* (2013.01); *G03F 7/00* (2013.01); *H01L 21/02675* (2013.01); *H01L 27/124* (2013.01); *H01L 27/127* (2013.01); *H01L 27/1218* (2013.01); *H01L 27/1225* (2013.01); *H01L 27/1229* (2013.01); *H01L 27/1248* (2013.01); *H01L 27/1274* (2013.01); *H01L 29/42384* (2013.01); *H01L 29/66757* (2013.01); *H01L 29/66969* (2013.01); *H01L 29/78675* (2013.01); *H01L 29/78693* (2013.01); *G02F 1/1368* (2013.01); *G02F 1/134363* (2013.01); *G02F 1/136227* (2013.01); *G02F 2001/13685* (2013.01); *G02F 2202/104* (2013.01); *H01L 21/02532* (2013.01); *H01L 21/02565* (2013.01); *H01L 21/02592* (2013.01); *H01L 27/3258* (2013.01); *H01L 27/3262* (2013.01); *H01L 27/3276* (2013.01); *H01L 2227/323* (2013.01)

(58) Field of Classification Search
CPC ...... H01L 27/1255; H01L 29/7869–29/78693; H01L 29/6675–29/66765; H01L 29/78672–29/78678; H01L 27/1251
See application file for complete search history.

(56) References Cited

U.S. PATENT DOCUMENTS

2014/0131703 A1    5/2014  Miyamoto et al.
2017/0294456 A1*  10/2017  Lee .................... H01L 21/02164

FOREIGN PATENT DOCUMENTS

WO    2012/176422 A1    12/2012

* cited by examiner

*Primary Examiner* — Jose R Diaz
(74) *Attorney, Agent, or Firm* — Typha IP LLC

(57) ABSTRACT

The purpose of the present invention is to form both LTPS TFT and Ply-Si TFT on a same substrate. The feature of the display device to realize the above purpose is that: a display device comprising: a substrate including a first TFT having an oxide semiconductor layer and a second TFT having a Poly-Si layer, an undercoat is formed on the substrate, the oxide semiconductor layer is formed on or above the undercoat, a first interlayer insulating film is formed on or above the oxide semiconductor layer, the Poly-Si layer is formed on or above the first interlayer insulating film.

16 Claims, 13 Drawing Sheets

(51) Int. Cl.
*G02F 1/1343* (2006.01)
*G02F 1/1362* (2006.01)
*G02F 1/1368* (2006.01)
*H01L 27/32* (2006.01)

DISPLAY DEVICE AND MANUFACTURING METHOD THEREOF

CLAIM OF PRIORITY

The present application claims priority from Japanese Patent Application JP 2016-179378 filed on Sep. 14, 2016, the content of which is hereby incorporated by reference into this application.

BACKGROUND OF THE INVENTION

(1) Field of the Invention

The present invention relates to a display device of hybrid structure, which includes both of a TFT of poly-silicon and a TFT of oxide semiconductor.

(2) Description of the Related Art

A liquid crystal display device comprises a TFT substrate where thin film transistors (TFT) and pixel electrodes are formed and a counter substrate opposing to the TFT substrate, wherein a liquid crystal layer is sandwiched between the TFT substrate and the counter substrate. Images are formed by controlling the transmittance of lights in each of pixels. On the other hand, an organic EL display forms color images by an organic light emitting layer and a TFT formed in individual pixels. An organic EL display has a merit for a thin display device compared to a liquid crystal display device since an organic EL display device does not need a backlight.

LTPS (Low Temperature Poly-Si) is suitable for a TFT in a driving circuit. On the contrary, an oxide semiconductor has a high OFF resistance, thus gives a TFT of low OFF current.

WO 2012/176422 discloses a display device having a hybrid structure including a TFT of LTPS and a TFT of oxide semiconductor wherein the TFT of LTPS is formed before the TFT of oxide semiconductor is formed. The TFT of the oxide semiconductor of WO 2012/176422 is a so called bottom contact type where a drain electrode and a source electrode contact at a bottom of the oxide semiconductor of the TFT. In the meantime, the bottom contact type tends to have a high contact resistance.

SUMMARY OF THE INVENTION

A switching TFT in a pixel needs to have low leak current. A TFT of oxide semiconductor can make a low leak current TFT. Herein after an oxide semiconductor, which is amorphous and optically transparent, is called TAOS (Transparent Amorphous Oxide Semiconductor). TAOS includes IGZO (Indium Gallium Zinc Oxide), ITZO (Indium Tin Zinc Oxide), ZnON (Zinc Oxide Nitride), IGO (Indium Gallium Oxide), and so on. Herein after, an oxide semiconductor is represented by TAOS. TAOS has a character that a mobility of carriers is low, thus, sometimes it is difficult to form a driving circuit by the TFT of TAOS built in the display device. Herein after TAOS is used also as a term of TFT including TAOS in this specification.

On the other hand, the TFT of LTPS has high carrier mobility, thus a driving circuit can be formed by the TFT of LTPS. Herein after, a term of LTPS is also used as a term of TFT including LTPS. Since a TFT of LTPS has a character that a leak current is comparatively high, serially connected two TFTs of LTPS are used for a switching TFT.

Consequently, it is reasonable to use the TAOS for a switching element and to use the LTPS for a driving circuit. Forming through holes is necessary in insulating layers, which cover the TAOS or the LTPS, to supply currents or signals for the TAOS or the LTPS. The TAOS and the LTPS are formed on a different layer, thus, numbers of layers that through holes are formed are different for the TAOS and the LTPS.

Conventionally, the LTPS was formed prior to the TAOS, thus a depth of through holes for the LTPS is deeper than a depth of a through holes for the TAOS. In other words, through holes for the TAOS experience over etching since through holes for the LTPS are formed simultaneously; consequently, there was a problem that a drain and a source of the TAOS at the trough holes disappear.

In addition, the TAOS has a problem that its characteristics are changed when a light is irradiated. This problem can be avoided when the TAOS has an experience to have been annealed in high temperature. However, in the conventional structure, annealing of TAOS in high temperature causes a change of characteristic of the LTPS since the LTPS is formed prior to the TAOS.

In a hybrid structure of a top contact type TAOS and a top contact type LTPS where drain electrodes and source electrodes contact at upper side of the TAOS and the LTPS, one purpose of the present invention is to prevent a disappearance of the TAOS at the through holes. Another purpose of the present invention is to realize the TAOS whose characteristics do not change so much even if it is irradiated by light in the hybrid structure.

The present invention solves the above described problems; concrete measures are as follows:

(1) A display device comprising: a substrate including a first TFT having an oxide semiconductor layer and a second TFT having a Poly-Si layer, an undercoat is formed on the substrate, the oxide semiconductor layer is formed on or above the undercoat, a first interlayer insulating film is formed on or above the oxide semiconductor layer, the Poly-Si layer is formed on or above the first interlayer insulating film.

(2) A display device comprising: a substrate including a first TFT having an oxide semiconductor layer and a second TFT having a Poly-Si layer, an undercoat is formed on the substrate, the first TFT is formed on the undercoat, an AlO layer is formed on or above the first TFT, a second undercoat is formed covering the AlO layer, the second TFT is formed on the second undercoat.

(3) A manufacturing method of a display device including a substrate having a first TFT containing an oxide semiconductor layer and a second TFT containing a Poly-Si layer comprising, forming the oxide semiconductor layer, then forming a first interlayer insulating film on or above the oxide semiconductor layer, forming a a-Si layer on the first interlayer insulating film, then performing a patterning of the a-Si layer, after that, transforming the a-Si layer to the Poly-Si layer by irradiating excimer laser on the a-Si layer to form the second TFT.

DETAILED DESCRIPTION OF THE PREFERRED EMBODIMENTS

The present invention will be described in detail referring to the following embodiments.

First Embodiment

Figure 1:
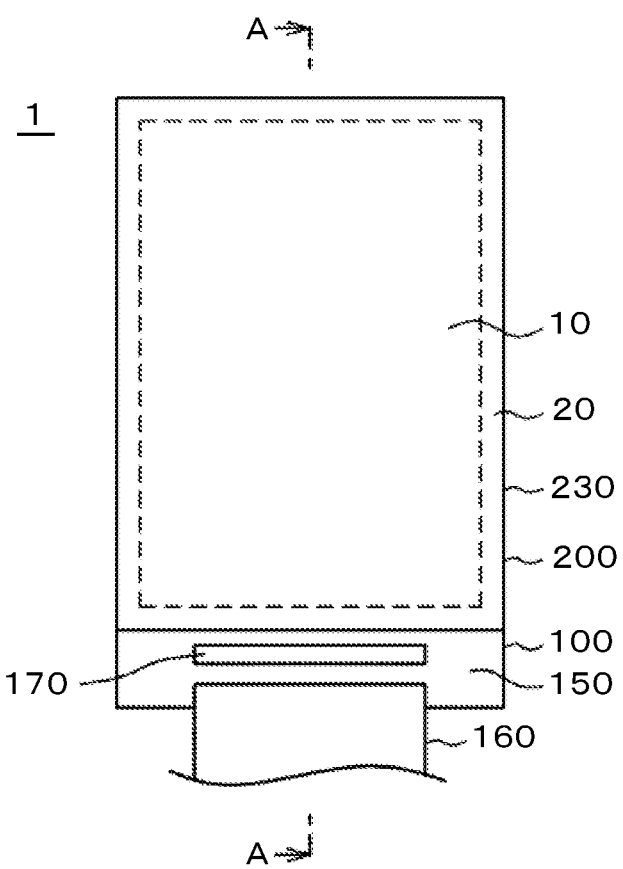
FIG. 1 is a plan view of a liquid crystal display device.
Figure 2:
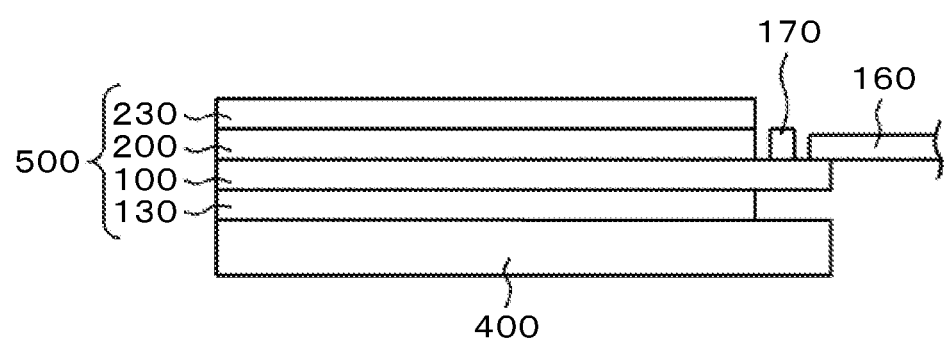
FIG. 2 is a cross sectional view along A-A of FIG. 1.

At the outset, the case where the present invention is applied to a liquid crystal display device is explained. FIG. 1 is a plan view of a liquid crystal display device 1 where the present invention is applied. FIG. 2 is a cross sectional view along A-A of FIG. 1. In FIG. 1 and FIG. 2, a TFT substrate 100 and a counter substrate 200 are opposed to each other and a liquid crystal layer is sandwiched between the TFT substrate 100 and the counter substrate 200. A lower polarizing plate 130 is attached underneath the TFT substrate 100: an upper polarizing plate 230 is attached on the counter substrate 200. An assembly of the TFT substrate 100, the counter substrate 200, the lower polarizing plate 130, the upper polarizing plate 230 is called the liquid crystal display panel 500.

The TFT substrate 100 is bigger than the counter substrate 200, a portion of the TFT substrate 100 where the counter substrate 200 does not overlap is the terminal area 150. The driver IC 170 that supply video signals is installed on the terminal area 150. The flexible circuit substrate 160 is connected to the terminal area 150. The back light 400 is set at a back of the liquid crystal panel 500 since the liquid crystal display panel 500 does not emit light itself.

The liquid crystal display device can be divided into the display area 10 and the peripheral area 20 as described in FIG. 1. Many pixels are formed in the display area 10 and each of the pixels has a switching TFT. A driving circuit, which drives scanning lines or video signal lines, is formed in the peripheral area 20.

TAOS, which has low leak current, is suitable for a 111 in a pixel; Poly-Si (Poly-Silicon), which has high mobility, is suitable for a driving circuit. Since LTPS is often used as Poly-Si in a liquid crystal display device, Poly-Si is sometimes described as LTPS in this specification.

However, a mobility of the a-Si is sometimes acceptable for certain display devices, the present invention is also applicable to a display device where a peripheral driving circuit is formed by the a-Si (amorphous-Silicon).

As described in WO 2012/176422, conventionally, LTPS is first formed, after that TAOS is formed. The reason is as follows: LTPS is formed originally as a-Si by CVD then a-Si is transformed to Poly-Si by excimer laser. a-Si formed by CVD contains a lot of hydrogen, thus annealing for de-hydrogen (de-hydrogen annealing) is necessary. TAOS changes its characteristics when it is exposed to hydrogen. Thus, if hydrogen, which is generated at de-hydrogen annealing, reaches to the TAOS, the characteristics of the TAOS become unstable.

To overcome the above problem, conventionally, LTPS is formed first, after that TAOS is formed. However, the above method causes the following problems: A number of layers that through holes for drain electrodes or source electrodes for the LTPS penetrate is more than a number of layers that through holes for drain electrodes or source electrodes for the TAOS penetrate. Consequently, the TAOS is over etched and disappears at a bottom of the through holes, thus the TAOS TFT cannot be stably formed.

Another problem when LTPS is formed first is as follows: Since characteristics of TAOS are degraded when light is irradiated, a high temperature annealing is necessary for TAOS to avoid degradation due to light exposure. In the meantime, the LTPS changes its characteristics when it experiences a high temperature process. When the TAOS experiences a high temperature annealing, the LTPS changes its characteristics since the LTPS experiences high temperature annealing at the same time because the LTPS is already formed prior to the TAOS.

Figure 3:
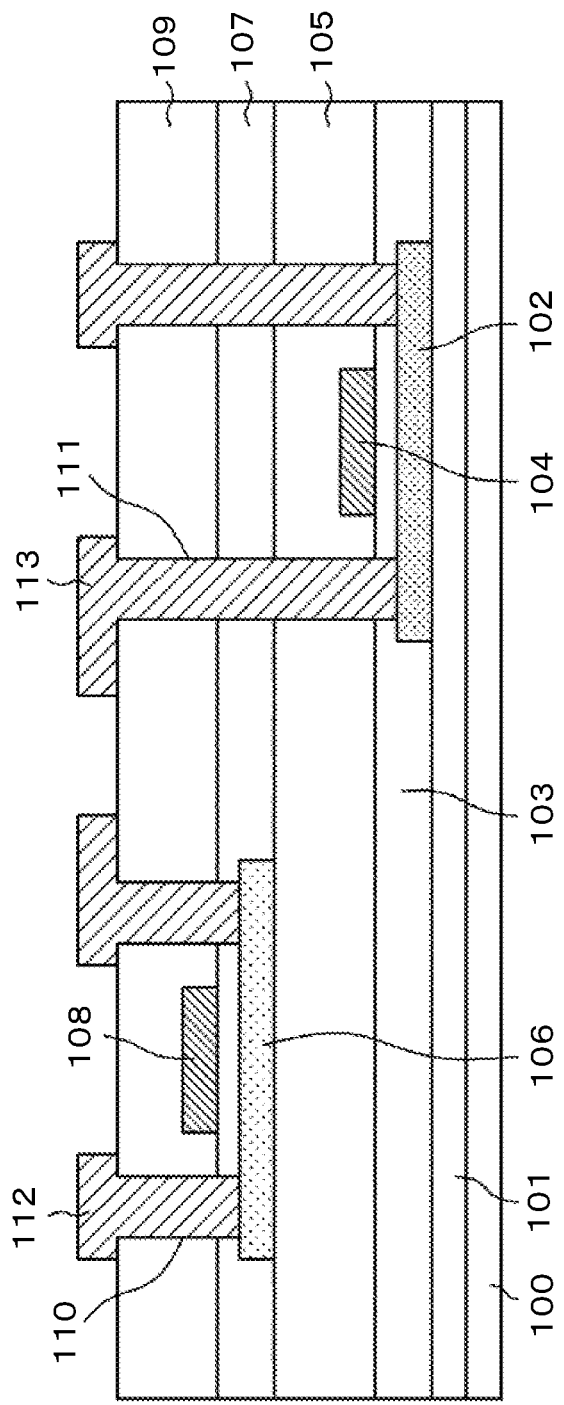
FIG. 3 is a cross sectional view of embodiment 1.

To overcome the above problems, the present invention has a structure that the TAOS is formed prior to the LTPS. FIG. 3 is a cross sectional view of the present invention. Left hand TFT is LTPS and right hand TFT is TAOS in FIG. 3.

In FIG. 3, the first undercoat 101 is formed on the TFT substrate 100 that is formed by glass or resin. The first undercoat 101 is generally formed by a laminated film of SiO and SiN. In this specification, a notation of AB (e.g. SiO) means a compound formed by A and B; however, it does not necessarily mean A and B are the same amount; even a basic ratio of elements exists, according to process conditions, a ratio between A and B becomes different from the basic ratio. It is the same for AlO, which appears later in the specification.

The SiN for the first undercoat 101 is formed by CVD; this SiN layer discharges hydrogen. The TAOS 102, which is formed on the first undercoat 101, deteriorates its characteristics when it is exposed to hydrogen; therefore, it is preferable to make the upper layer of undercoat 101 by the SiO film, which contacts the TAOS 102. In addition, this structure is reasonable because oxygen is supplied from the SiO film to the TAOS 102 during the TAOS experiences annealing, thus, characteristics of the TAOS 102 are improved.

In FIG. 3, the TAOS 102 is formed and patterned for the TAOS TFT. In this state, other layers on the TFT substrate 100 are only the first undercoat 101, thus, the TAOS 102 can be annealed in high temperature. Therefore, the TAOS 102, which does not deteriorate its characteristics much even when light is irradiated, can be formed.

The first gate insulating film 103 is formed to cover the TAOS 102 by CVD using SiH4 (silane) and N2O (nitrous oxide). The first gate electrode 104 is formed on the first gate insulating film 103. A TFT where a gate electrode is set above a semiconductor layer is called a top gate type TFT. The first gate electrode 104 is formed by e g a laminated layer of Ti—Al alloy-Ti, or MoW alloy. Although omitted in FIG. 3, it is also possible to form a light shielding layer at a position of the LTPS to suppress a photo current in LTPS simultaneously with forming the first gate electrode 104 on the same layer as the first gate electrode 104.

The first interlayer insulating film 105 is formed to cover the first gate electrode 104. The first interlayer insulating film 105 is formed by SiO or SiN or a laminated film of SiO and SiN. When the interlayer insulating film is formed by a laminated film, considering an influence to the TAOS 102, it is preferable to make the SiO film as an uderlayer since the SiN film discharges hydrogen. It is also possible to sandwich the SiN film by the SiO films.

The LTPS 106 for a LTPS TFT is formed on the first interlayer insulating film 105. In the present invention, as described later, the a-Si is formed and patterned first, then de-hydrogen annealing for the a-Si is applied in 400-500 degrees Celsius. After that the a-Si is transformed to the Poly-Si by irradiating excimer laser. The above explained process enables to form the TAOS 102 prior to the LTPS 106.

The second gate insulating film 107 is formed to cover the LTPS 106. The second gate insulating film 107 can be formed by SiO with TEOS (Tetraethyl orthosilicate) as material. The second gate electrode 108 is formed on the second gate insulating film 107. The second gate electrode layer is formed by e g a laminated layer of Ti—Al alloy-Ti or MoW alloy, the same as the first gate electrode 104.

The second interlayer insulating film 109 is formed to cover the second gate electrode 108 and the second gate insulating film 107. The second interlayer insulating film 109 is formed by the SiO film or the SiN film or a laminated film of the SiO film and the SiN film. Since the SiN film discharges hydrogen, it is reasonable to set the SiN film as an under layer for a termination with hydrogen for LTPS by hydrogen discharged from the SiN film.

The termination process is to terminate dangling bonds of the LTPS by hydrogen to make the characteristics of the LTPS stable. The terminating process is performed by annealing the LTPS in 400-500 degrees Celsius in hydrogen atmosphere.

After that, the through holes 110 for the source/drain electrodes 112 of the LTPS TFT and the through holes 111 for the source/drain electrodes 113 of the TAOS TFT are formed. Those through holes are formed by dry etching using e.g. CF base (e.g. CF4) gas or CHF base (e.g. CHF3) gas.

As depicted in FIG. 3, through holes 110 for the LTPS 106 penetrate into two insulating layers while the through holes 111 for the TAOS 102 penetrate into four insulating layers. Therefore, etching condition for through holes must be adjusted for the through holes 111 for the TAOS 102. Namely, the Poly-Si 108 is exposed to etching gas for a longer time. However, there is an etching condition that an etch selectivity is high for the Poly-Si, and it is possible to adopt this condition.

Figure 4:
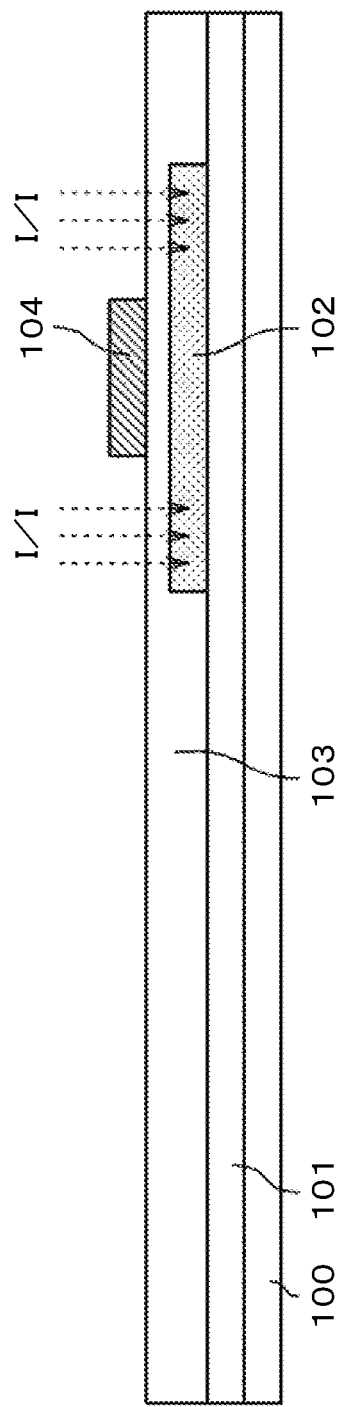
FIG. 4 is a cross sectional view up to a process forming the first gate electrode.

FIGS. 4-9 are cross sectional views of interim processes to realize the above explained structure. FIG. 4 is a state that: the first undercoat 101 is formed on the TFT substrate 100, the TAOS 102 is formed on the first undercoat 101, the first gate insulating film 103 is formed on the TAOS 102, the first gate electrode 104 is formed on the first gate insulating film 103. In FIG. 4, the ion implantation (I/I) is conducted using the first gate electrode 104 as a mask, thus, the TAOS 102 gets conductivity other than an area covered by the first gate electrode 104.

B (Boron), P (Phosphor), Ar (argon) and so on are used as ions for the ion implantation (I/I), however, a kind of ions can be widely chosen according to process conditions or apparatuses for the ion implantation. The purpose of the ion implantation (I/I) is to form contact areas for the source and the drain of the TAOS 102.

In the meantime, other methods than the ion implantation, e.g. to introduce vacancies of oxide in TAOS, can be applicable to attain the above effect, namely forming the drain or the source in the TAOS 102.

Figure 5:
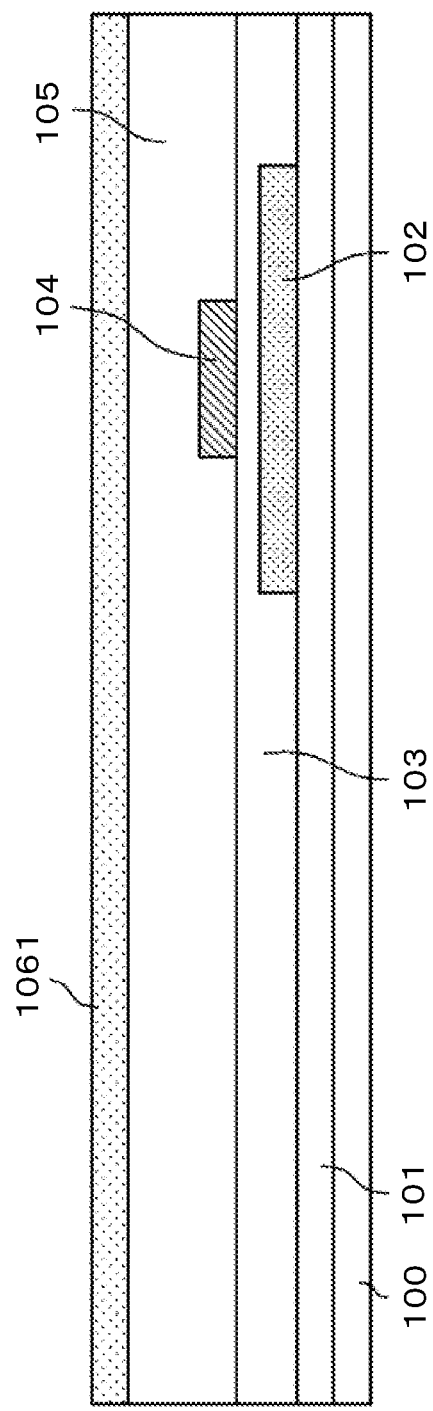
FIG. 5 is a cross sectional view up to a process forming the a-Si film.
Figure 6:
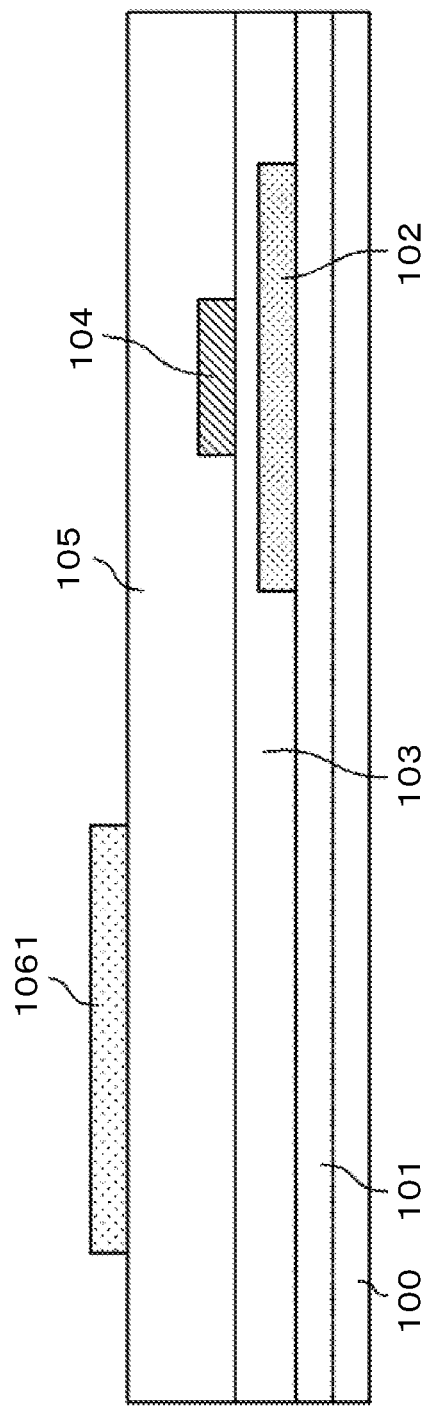
FIG. 6 is a cross sectional view up to a patterning of the a-Si film.

FIG. 5 is a cross sectional view that shows the first interlayer insulating film 105 and the a-Si 1061 are formed over the first gate electrode 104. As explained in FIG. 3, when the first interlayer insulating film 105 is a laminated film formed by the SiN film and the SiO film, the SiO film is preferably set as an under layer. At least the upper layer of the first interlayer insulating film 105 and the a-Si 1061 can be continuously formed by CVD, FIG. 6 shows the a-Si 1061 has been patterned. Conventionally, forming the LTPS 106 was performed as that: first, the a-Si is made, then de-hydrogen annealing is performed in 400-500 Celsius, then a translation from the a-Si to the Poly-Si is performed by applying excimer laser, after that, a patterning of the Poly-Si was made.

A large amount of hydrogen is discharged during the de-hydrogen annealing. If discharged hydrogen reaches to the TAOS 102 through the first inter layer insulating film 105 and the first gate insulating film 104, the hydrogen affects characteristics of the TAOS 102. To avoid this phenomenon, conventionally, the LTPS 106 was formed before the TAOS 102 was formed.

The feature of the present invention is, as depicted in FIG. 6, after forming the a-Si 1061, the patterning of the a-Si 1061 is made before the de-hydrogen annealing. After the patterning, de-hydrogen annealing is applied to the a-Si 1061. Even hydrogen is discharged from the a-Si 1061 in de-hydrogen annealing, since the a-Si 1061 is already patterned and exists at a remote position from the TAOS 102 in a plan view, a possibility that the discharged hydrogen reaches to the TAOS 102 is very low. In addition, the amount of discharged hydrogen decreases greatly since the a-Si 1061 is already patterned. In that reason, it is preferable the TAOS 102 and the LTPS 106 do not overlap in a plan view to improve the effect of the present invention.

Figure 7:
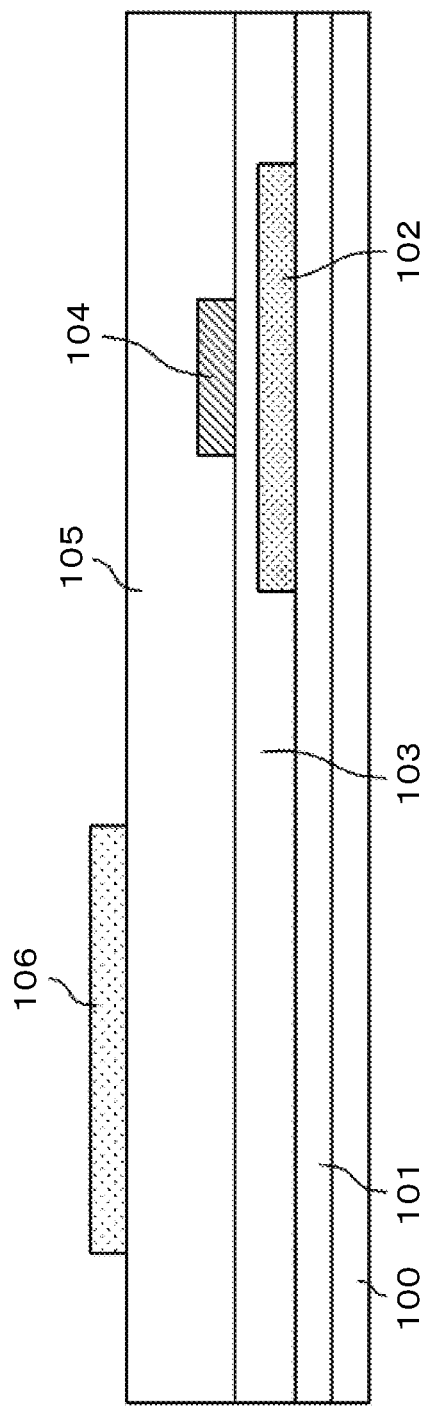
FIG. 7 is a cross sectional view where the a-Si film is transformed to the LTPS film.

De-hydrogen annealing is performed in 400-500 degree Celsius, at the same time, annealing of the TAOS 102 can be performed. After that, as depicted in FIG. 7, excimer laser is irradiated on the patterned a-Si 1061 to transform it to the Poly-Si 106. A local laser crystallization technology can be adopted in the laser irradiation.

Figure 8:
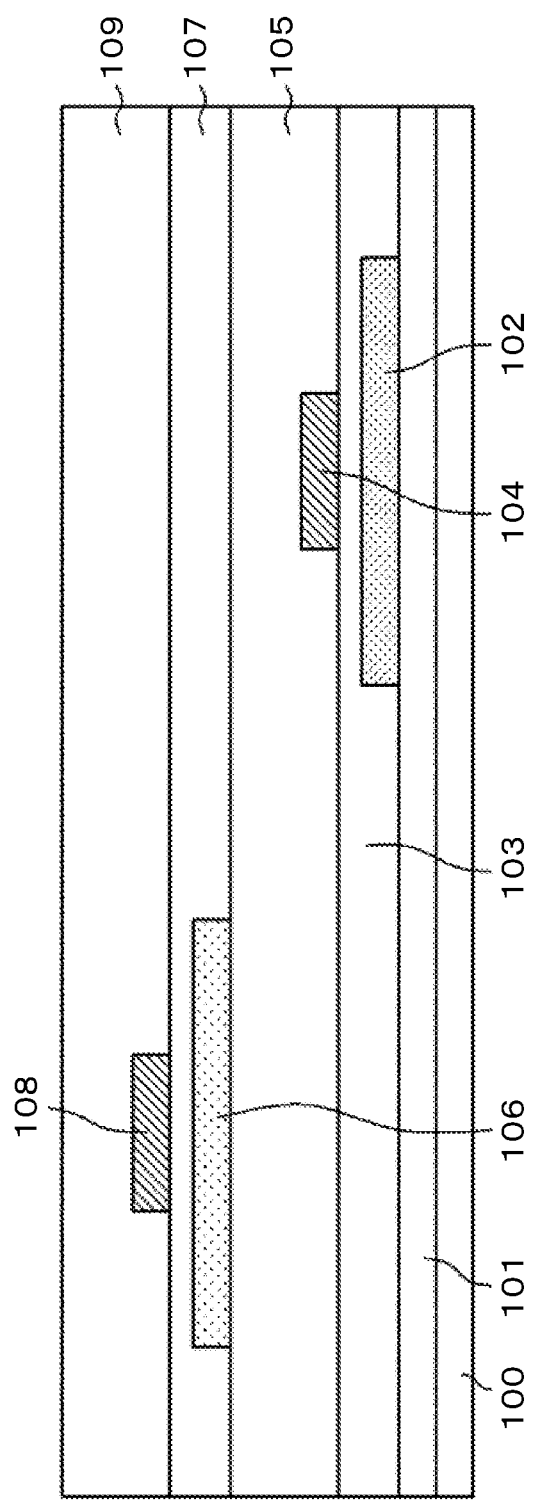
FIG. 8 is a cross sectional view up to the second interlayer insulating film is formed.

After that, as depicted in FIG. 8, the second gate insulation film 107 is formed on the Poly-Si 106, then, the second gate electrode 108 is formed on the second gate insulating film 107. In the meantime, B (boron) or P (Phosphor) is doped by the ion implantation using the second gate electrode 108 as a mask. Thus, the LTPS 106 that is not covered by the second gate electrode 108 gets conductivity of P-type or N-type, consequently, a drain or a source are formed in the LTPS 106.

After that, the second interlayer insulating film 109 is formed by SiO or SiN, or by a laminated film of SiO film and SiN film. When the second interlayer insulating film 109 is formed by a laminated film, it is reasonable to set the SiN film as an under layer for termination with hydrogen of the Poly-Si 106.

Figure 9:
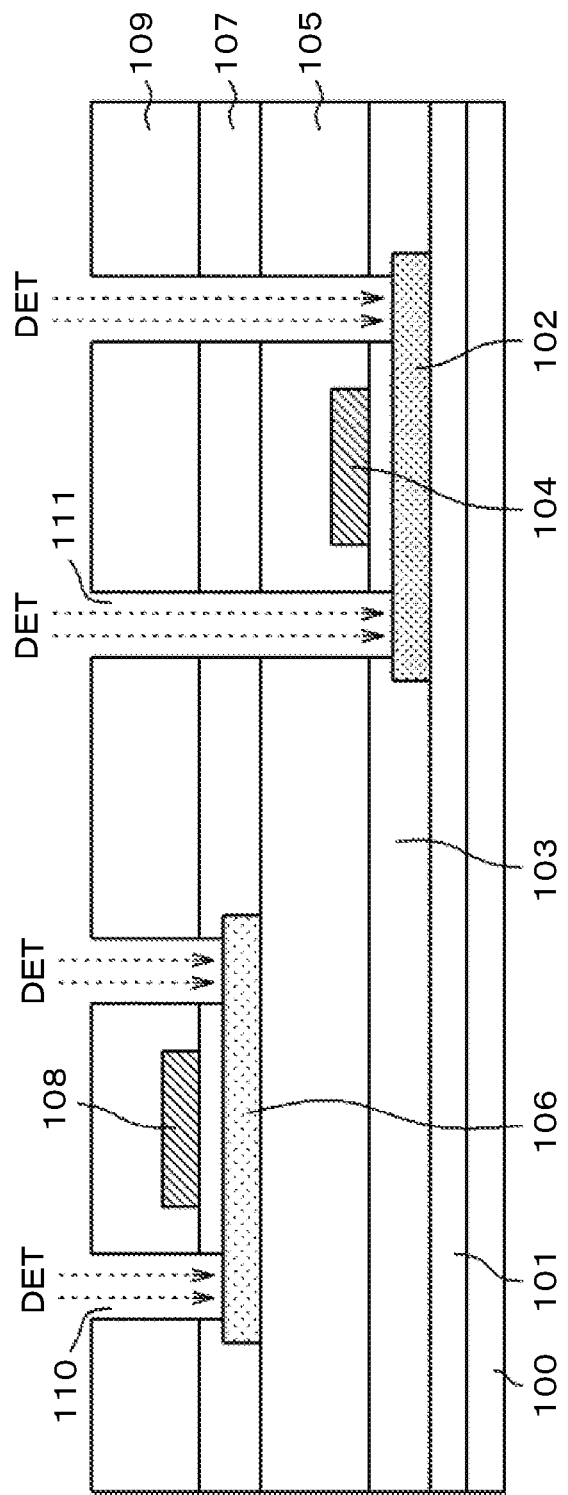
FIG. 9 is a cross sectional view up where though holes are being formed.

After that, as depicted in FIG. 9, the through holes 110 are formed by dry etching using Fluorescent based gas in the second interlayer insulating film 109 and the second gate insulating film 107 at a position corresponding to the drain and the source of the LTPS 106. At the same time, the through holes 111 are formed by dry etching in the second interlayer insulating film 109, the second gate insulating film 107, the first interlayer insulating film 105, and the first gate insulating film 103 at a position corresponding to the drain and the source of the TAOS 102. Notations DET and the arrows in FIG. 9 indicate the dry etching.

In this process, while the through holes 111 are made through four insulating layers for TAOS 102, the through holes 110 are made through only 2 insulating layers for LTPS 106. Thus, etching condition must be adjusted for the through holes 111 for the TAOS 102. In the through holes 110, the LTPS 106 is exposed to the dry etching gas, e.g. Fluorescent base gas, for a long time; however, there is an etching condition that an etching selection ratio is high between the LTPS and the gate insulating films, the interlayer insulating films, etc. This etching condition can be adopted in the present process.

On the contrary, an etching selection ratio between the TAOS 102 and the first gate insulating film, the first interlayer insulating film is low; however, the etching condition can be adjusted for the trough holes 111 for the TAOS 102, thus, the etching condition can be selected so that the TAOS 102 does not disappear. Therefore, sources and drains do not disappear in both of the LTPS 106 and the TAOS 102.

After that the source/drain electrodes 112 are formed in the through holes 110 and the source/drain electrodes 113 are formed in the through holes 111, thus, the structure of FIG. 3 is formed. By the way, both of a source electrode and a drain electrode may be called the source/drain electrode 112 or the source/drain electrode 113 in this specification. The source/drain electrode 112, 113 is formed bye g a laminated film of Ti, Al alloy, and Ti.

As described above, in the present invention, degradation of characteristics of the TAOS 102 due to light irradiation can be suppressed because the TAOS 102 can be annealed in high temperature. In addition, disappearance of the source or the drain of the TAOS 102 during forming of the through holes 111 can be avoided. Thus, a hybrid type TFT array of superior characteristics can be realized.

Though this embodiment was explained in that TFT is a top gate type, the present invention is possible to the structure that the second gate electrode is set between the TAOS 102 and the TFT substrate 100, which makes a bottom gate type TFT. The heart of the present invention is that a distance between the Poly-Si 106 and the TFT substrate 100 is bigger than a distance between the TAOS 102 and the TFT substrate, thus, through holes for connecting source or drain can be deeper at the TAOS than at the LTPS; consequently, the process to avoid the disappearance of the TAOS at the through holes 111 can be realized.

Second Embodiment

Figure 10:
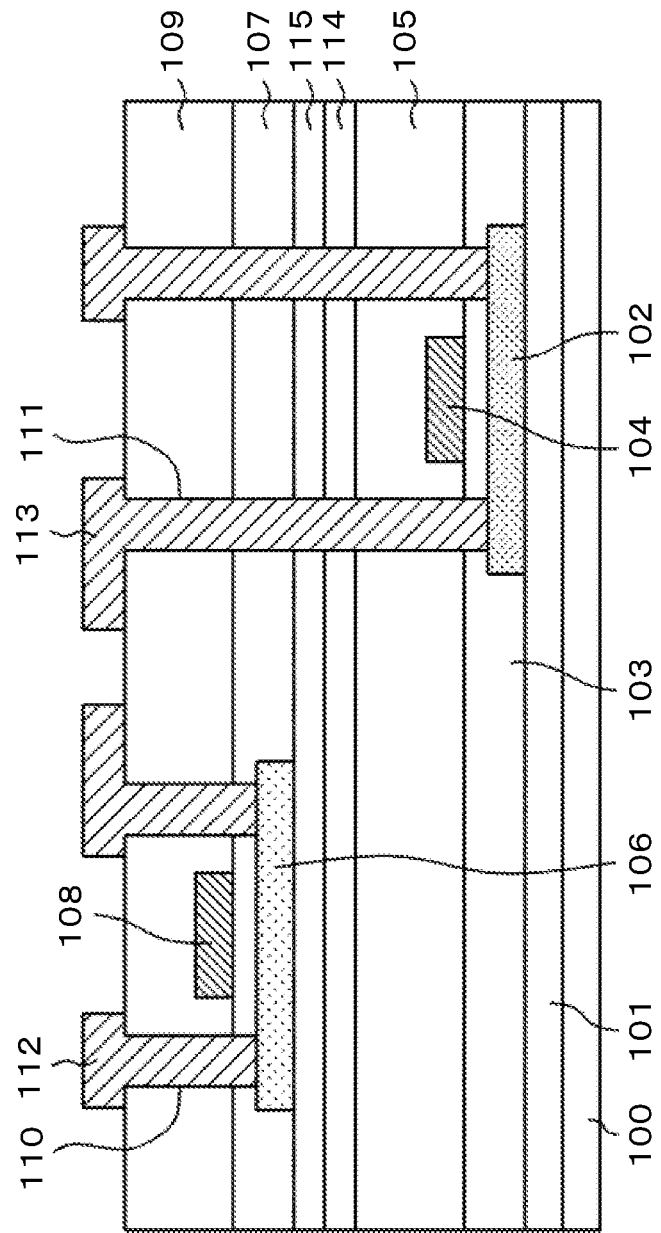
FIG. 10 is a cross sectional view of embodiment 2.

FIG. 10 is a cross sectional view of embodiment 2. FIG. 10 differs from FIG. 3 in that the AlO film 114 as a blocking layer is formed between the first interlayer insulating film 105 and the LTPS 106, and the second undercoat 15 is formed on the AlO film 114. The AlO has a good blocking ability against hydrogen. A layer other than the AlO can be used as far as it has a good blocking ability against hydrogen. For that purpose, an insulating film formed by Metal Oxide or Metal Nitride is preferably used. The AlO film 114 discharges oxygen during annealing, this oxygen further stabilizes the character of TAOS 102. The AlO film 114 is formed by sputtering. The thickness of the AlO film 114 is e.g. 50 nm.

In the meantime, the oxygen, discharged from the AlO film 114 during the annealing, deteriorates the characteristics of LTPS 106. To avoid this phenomenon, the second undercoat 115 is formed on the AlO film 114. A laminated film of SiN and SiO is used for the second undercoat 115. Since the LTPS is formed on the second undercoat 115, the SiN film of the laminated film is preferably sandwiched by the SiO films.

In this embodiment, too, the a-Si 1061 is first formed and then the a-Si 1061 is transformed to the LTPS 106 by irradiating excimer laser. As explained in embodiment 1, in this embodiment, too, the following processing order is best: patterning a-Si 1061 first, then de-hydrogen annealing, after that transforming to Poly-Si 106 by excimer laser.

In this embodiment, however, the AlO film 114 can block hydrogen. Thus, it is also possible, as conventional, to take a process order that: forming the a-Si 1061 on the first undercoat 115, then de-hydrogen annealing, then irradiating excimer laser on the a-Si to transform to the Poly-Si 106, after that the Poly-Si is patterned.

In the meantime, the first interlayer insulating film 105 can be eliminated because hydrogen that comes from upper layers can be blocked by the AlO film 114. The AlO film 114 may discharge oxygen when de-hydrogen annealing of the a-Si 1061 or hydrogen termination annealing for the LTPS 106 are made; however, this oxygen is rather preferable since it stabilizes the characteristics of the TAOS 102.

Embodiment 2 also has a structure that the TAOS 102 is formed on under layer and the LTPS 106 is formed on upper layer, thus disappearance of the source or the drain of the TAOS can be avoided when the through holes 110 and 111 are made. In addition, the TAOS 102 can be annealed in high temperature since the TAOS 102 is formed prior to the LTPS 106, thus, the TAOS can have stable characteristics.

As described above, embodiment 2 also realizes a hybrid type TFT array substrate where the TAOS has stable characteristics.

Third Embodiment

Figure 11:
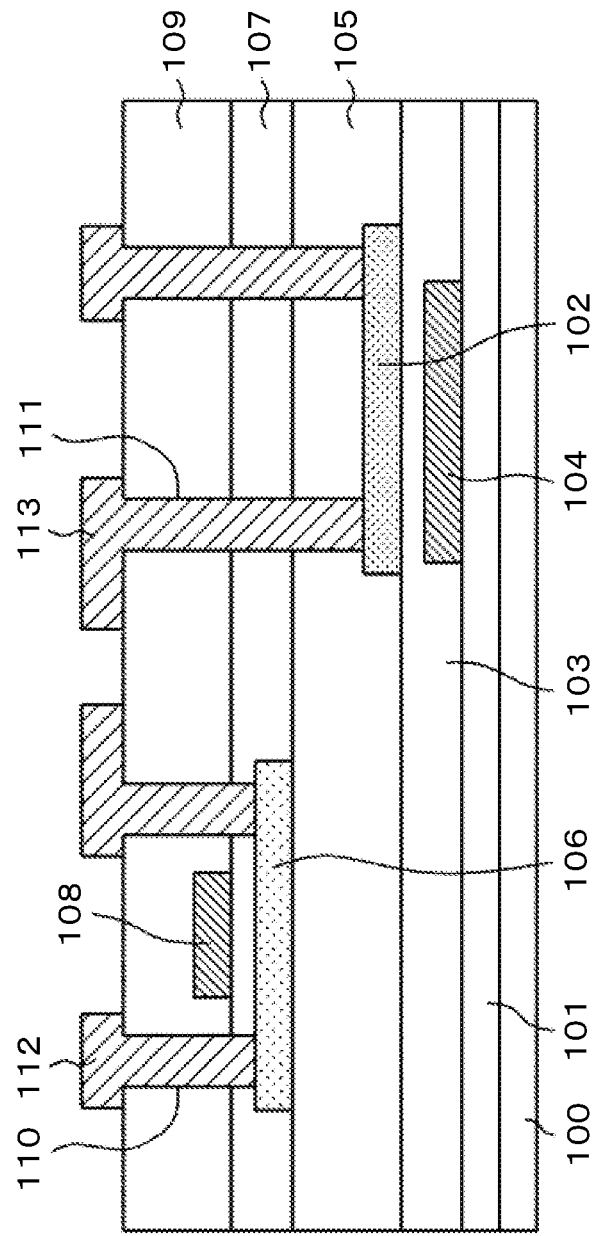
FIG. 11 is a cross sectional view of embodiment 3.

FIG. 11 is a cross sectional view of embodiment 3. FIG. 11 differs from FIG. 3 in that the TAOS TFT is a bottom gate type TFT. A bottom gate type TFT is that a gate electrode, opposing to a semiconductor layer, is between the semiconductor layer and a TFT substrate. In FIG. 11, the first undercoat 101 is formed on the TFT substrate 100, then, the first gate electrode 104 is formed on the undercoat 101. The first gate insulating film 103 covers the gate electrode 104 and the TAOS 102 is formed on the first gate insulating film 103. The first gate insulating film 103, as in FIG. 3, is a SiO layer formed by CVD using SiH4 (silane) and N2O (nitrous oxide) as material.

The TAOS 102 is formed on the first gate insulating film 103. The first interlayer insulating film 105 is formed on the first gate insulating film 103. The first interlayer insulating film 105 is a laminated film of SiO and SiN. A layer of the first insulating layer that contacts the TAOS 102 is the SiO film. Since SiN discharges hydrogen in annealing the SiN film should not contact the TAOS 102. On the other hand, it is reasonable to set the SiN film as an upper layer of the first interlayer insulating film 105 because the SiN film can be a source of hydrogen for hydrogen termination of the LTPS 106, which is formed on the first interlayer insulating film 105.

After LTPS 106 is made, processes are the same as explained in FIG. 3. Namely, a-Si 1061 is first patterned after the deposition, then de-hydrogen annealing is applied; excimer laser is irradiated on the patterned a-Si 1061 to transform the a-Si 1061 to the Poly-Si 106.

Embodiment 3 also has a structure that the TAOS 102 is formed under the LTPS, thus disappearance of the TAOS at the trough holes 111 can be avoided since the etching condition can be precisely controlled to adjust to a depth of the through holes 111. In addition, the TAOS 102 can be annealed in high temperature without considering influence to the LTPS 106 since the TAOS 102 is formed prior to the LTPS 106, thus, deterioration in characteristics of the TAOS due to light irradiation can be suppressed.

FIG. 11 is an example that a bottom gate type TAOS TFT is applied to the structure of embodiment 1. However, the bottom gate type TAOS TFT is also applicable to the structure of embodiment 2. In this case, in embodiment 2, the layer of AlO 114 becomes nearer to the TAOS 102, it is rather preferable structure for the TAOS 102 since the AlO 114 discharges oxygen during an annealing process.

Fourth Embodiment

Figure 12:
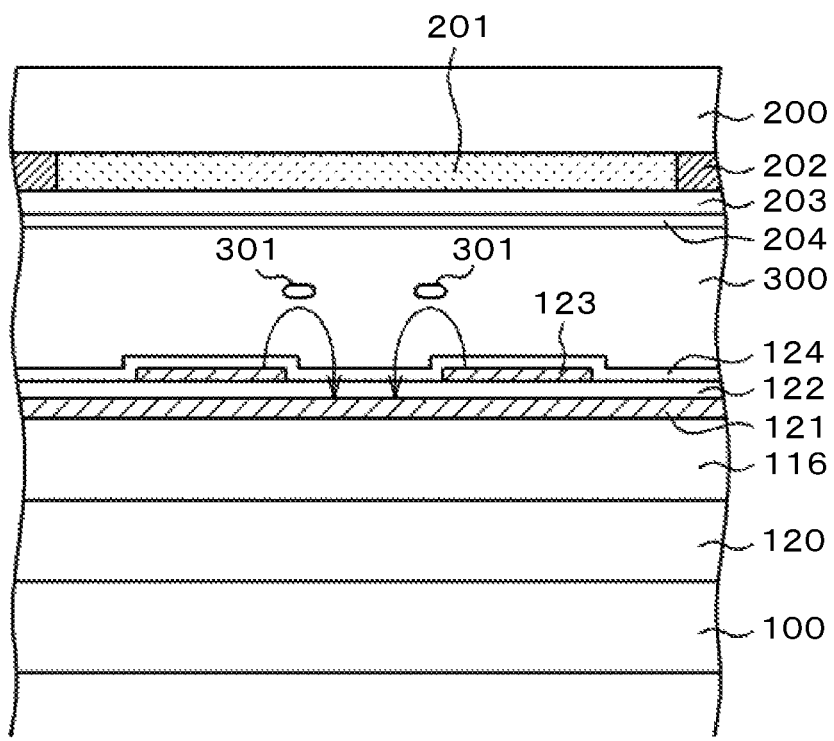
FIG. 12 is a cross sectional view of a display area of a liquid crystal display device.

FIG. 12 is a cross sectional view that the TAOS TFTs, explained in embodiments 1-3, are used in a display area of a liquid crystal display device. The TFT array layer 120 is formed on the TFT substrate 100. TFT array layer 120 has a TAOS TFT array layer structure depicted by e.g. FIG. 3; after that the organic passivation film 116 is formed on the TFT array layer 120.

FIG. 12 is an IPS type liquid crystal display device where the common electrode 121 of a planar shape is formed on the organic passivation film 116. The capacitive insulating layer 122 is formed on the common electrode 121 and the pixel electrode 123 is formed on the capacitive insulating layer 122. The pixel electrode 113 is comb like shaped or stripe like shaped. The alignment layer 124, for intimal alignment of the liquid crystal molecules 301, is formed on the pixel electrode 123.

When a video signal is applied to the pixel electrode 123, then a potential difference is formed between the pixel electrode 123 and the common electrode 121, a line of force is generated as depicted by an arrow in FIG. 12, which rotates the liquid crystal molecules 301 and consequently a transmittance of the liquid crystal layer 300 is controlled, thus images are formed.

In FIG. 12, the counter substrate 200 is set above the TFT substrate 100 to sandwich the liquid crystal layer 300. The color filter 201 and the black matrix 202 are formed on the counter substrate 200. The overcoat film 203 is formed over the color filter 201 and the black matrix 202; the alignment film 204 is formed on the overcoat film 203.

In a liquid crystal display device, when a video signal is applied to the pixel electrode 123, a voltage is retained for one frame period by a storage capacitance formed between the pixel electrode 123 and the common electrode 122 sandwiching the capacitive insulating layer 122. In this case, if a leak in TFT is large, the voltage of the pixel electrode 123 changes, thus, flickers occur; consequently, images are deteriorated. According to the present invention, a leak of TFT can be made low, thus, a liquid crystal display device having high quality images is realized.

Fifth Embodiment

Figure 13:
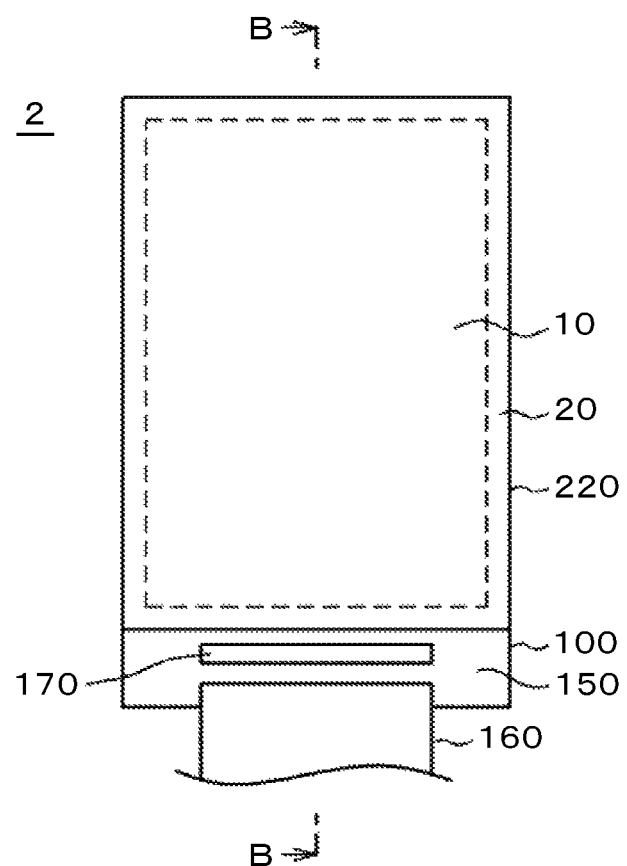
FIG. 13 is a plan view of an organic EL display device.

A combination of the LTPS TFTs and the TAOS TFTs explained in embodiments 1-3 can be applied to an organic EL display device. FIG. 13 is a plan view of the organic EL display device 2. The organic EL display device 2 of FIG. 13 has the display area 10 and the peripheral circuit area 20. TFTs for driving organic EL layers and switching TFTs are formed in the display area 10. A TAOS TFT, which has a low leak current, is preferable for a TFT formed in the display area. A peripheral circuit is formed by mainly Poly-Si TFTs in the peripheral circuit area 20.

The polarizing plate 220 for preventing reflection is adhered to the display area 10. Since an organic EL display has a reflection electrode, the polarizing plate 220 is used to prevent a reflection of external light. The terminal area 150 is formed outside of the display area 10. The driver IC 170 is installed on the terminal area 150. The flexible wiring circuit plate 160, which supplies power or signals to the organic EL display, is connected to the terminal area 150.

Figure 14:
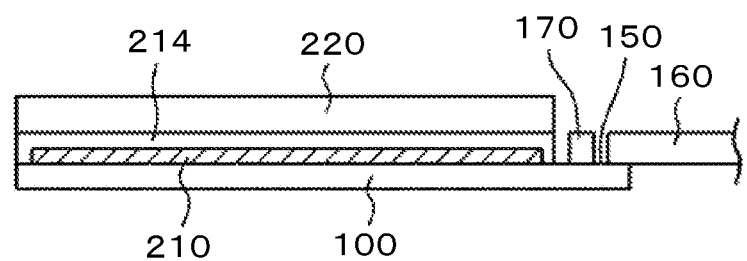
FIG. 14 is a cross sectional view along B-B of FIG. 13.

FIG. 14 is a cross sectional view of FIG. 13 along B-B line. The display element layer 210, which includes organic EL layers, is formed on the TFT substrate 100. The display element layer 210 is formed corresponding to the display area 10 of FIG. 13. Since an organic EL substance is decomposed by moisture, the protecting layer 214 made by SiN is formed to cover the display element layer 214. The terminal area 150 is formed outside of the display element layer 210; the driver IC 170 is installed on the terminal area 150 and the flexible wiring circuit plate 160 is connected to the terminal area 150.

Figure 15:
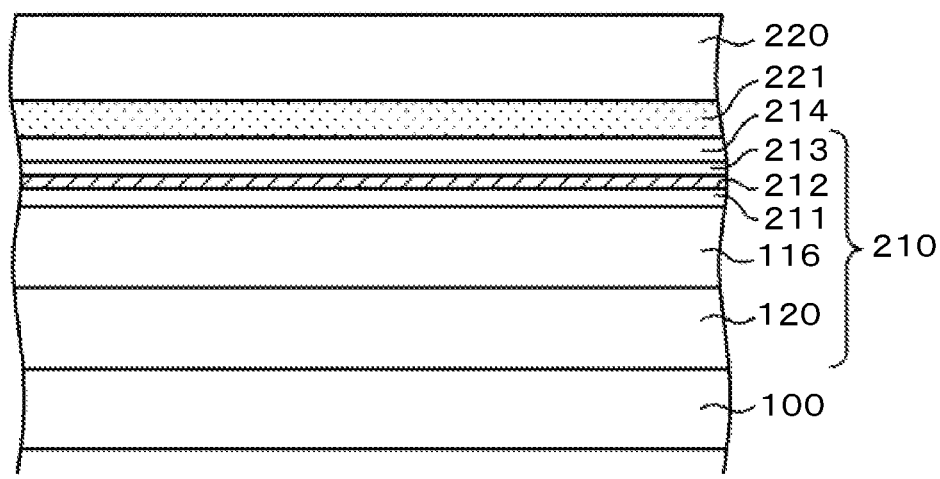
FIG. 15 is a cross sectional view of a display area of an organic EL display device.

FIG. 15 is a cross sectional view of the display area of the organic EL display device. The TFT array layer 120 is formed on the TFT substrate 100. The TFT array layer 120 includes the layer structure of TFTs of FIG. 3; the organic passivation film 116 is formed on the TFT array layer 120.

The lower electrode 211 is formed on the organic passivation film in FIG. 15. The lower electrode 211 is a laminated structure of metal or alloy, which comprises a reflection electrode, and a transparent conductive film constituting an anode. The organic EL layer 212 is formed on the lower electrode 211. The organic EL layer 212 includes e.g. an electron injection layer, an electron transportation layer, a light emitting layer, a hole transportation layer, and a hole injection layer.

The upper electrode 213, which works as a cathode, is formed on the organic EL layer 212. The upper layer 213 is formed by a transparent conductive film such as IZO (Indium Zinc Oxide) or ITO (Indium Tin Oxide). The upper electrode 213 can also be made by a thin film of metal as Silver or metal alloys. From the array layer 120 to the upper electrode layer 213 constitute the display element layer 210. The protecting layer 214 made by such as SiN is formed on the upper electrode 213; the polarizing plate 220 is adhered to the protecting layer 214 by the adhesive 221 to prevent a reflection of external light.

Several kinds of TFTs such as driving TFTs for the organic EL layer or switching TFTs exist in the TFT array layer 120. According to the present invention, LTPS TFTs and TAOS TFTs can be formed by a common process, consequently, various combinations of LTPS TFTs and TAOS TFTs are possible. Therefore, an organic EL display device having high quality images and low power consumption can be realized.

In the above embodiments, the TAOS TFTs are used in the display area and the LTPS TFTs are used in the peripheral driving circuit; however, the TAOS TFTs can be added in the peripheral driving circuit or the LTPS TFTs can be added in the display area.

What is claimed is:

1. A display device comprising:
a substrate including a first TFT having an oxide semiconductor layer and a second TFT having a Poly-Si layer,
an undercoat is formed on the substrate, the oxide semiconductor layer is formed on or above the undercoat,
a first interlayer insulating film is formed on or above the oxide semiconductor layer,
the Poly-Si layer is formed on or above the first interlayer insulating film,
wherein a second interlayer insulating film is formed on or above the Poly-Si layer,
a second through hole is formed through the second interlayer insulating film and a second gate insulating film formed on the Poly-Si layer,
a second source/drain electrode connects with the second TFT through the second through hole,
a first through hole is formed through the second interlayer insulating film, the second gate insulating film and the first interlayer insulating film, and
a first source/drain electrode connects with the first TFT through the first through hole.

2. The display device according to claim 1,
wherein the first interlayer insulating film is formed by plural layers including a SiO layer and a SiN layer,
the SiO layer is formed on or above the oxide semiconductor layer.

3. The display device according to claim 1,
wherein the first through hole further penetrates a first gate insulating film that covers the oxide semiconductor layer,
the first source/drain electrode connects with the first TFT through the first through hole.

4. The display device according to claim 1,
wherein the first TFT is a bottom gate type TFT.

5. The display device according to claim 1,
wherein the first TFT is a top gate type TFT.

6. The display device according to claim 1,
wherein the undercoat includes a SiO layer, the SiO layer contacts the oxide semiconductor layer.

7. A display device comprising:
a substrate including a first TFT having an oxide semiconductor layer and a second TFT having a Poly-Si layer,
an undercoat is formed on the substrate,
the first TFT is formed on the undercoat,
an AlO layer is formed on or above the first TFT,
a second undercoat is formed covering the AlO layer,
the second TFT is formed on the second undercoat.

8. The display device according to claim 7,
wherein the Poly-Si layer and the oxide semiconductor layer do not overlap each other in a plan view.

9. The display device according to claim 7,
wherein a second interlayer insulating film is formed on the second TFT,
a second through hole is formed through the second interlayer insulating film and a second gate insulating film formed on the Poly-Si layer, a second source/drain electrode connects with the second TFT through the second through hole,
a first through hole is formed through the second interlayer insulating film, the second gate insulating film, the second undercoat and the AlO layer, a first source/drain electrode connects with the first TFT through the first through hole.

10. The display device according to claim 7,
wherein the second undercoat includes a SiO layer, the SiO layer contacts with the AlO layer.

11. The display device according to claim 7,
wherein the second undercoat is formed by plural films including a SiO layer and a SiN layer.

12. The display device according to claim 7,
wherein a first interlayer insulating film including a SiO layer is formed between the first TFT and the AlO layer.

13. The display device according to claim 9,
wherein a first interlayer insulating film including a SiO layer is formed between the first TFT and the AlO layer, the first through hole penetrate the first interlayer insulating film,
the first source/drain electrode connects with the first TFT through the first through hole.

14. The display device according to claim 9,
wherein the first through hole further penetrates a first gate insulating film covering the oxide semiconductor layer,
the first source/drain electrode connects with the first TFT through the first through hole.

15. The display device according to claim 9,
wherein the first TFT is bottom gate type.

16. The display device according to claim 14,
wherein the first TFT is top gate type.

* * * * *